United States Patent [19]

Contiero et al.

[11] Patent Number: 4,721,686

[45] Date of Patent: Jan. 26, 1988

[54] MANUFACTURING INTEGRATED CIRCUITS CONTAINING P-CHANNEL MOS TRANSISTORS AND BIPOLAR TRANSISTORS UTILIZING BORON AND ARSENIC AS DOPANTS

[75] Inventors: Claudio Contiero, Buccinasco; Paola Galbiati, Monza; Antonio Andreini, Milan, all of Italy

[73] Assignee: SGS Microelettronica S.p.A., Catania, Italy

[21] Appl. No.: 6,037

[22] Filed: Jan. 22, 1987

[30] Foreign Application Priority Data

Jan. 24, 1986 [IT] Italy ................................ 19173 A/86

[51] Int. Cl.[4] .................... H01L 21/38; H01L 21/425
[52] U.S. Cl. ........................................ 437/31; 437/41; 437/59; 437/60; 437/151
[58] Field of Search .............. 148/190, 191; 29/576 B, 29/577 C, 571

[56] References Cited

U.S. PATENT DOCUMENTS

| | | | |
|---|---|---|---|
| 3,667,006 | 5/1972 | Ruegg | 148/175 X |
| 3,915,767 | 10/1975 | Welliver | 148/190 |
| 4,087,900 | 5/1978 | Yiannoulos | 148/190 X |
| 4,263,067 | 4/1981 | Takahashi et al. | 148/190 |
| 4,404,048 | 9/1983 | Vogelzang | 148/190 |
| 4,435,895 | 3/1984 | Parillo et al. | 29/571 |
| 4,485,552 | 12/1984 | Magdo et al. | 29/577 C |

Primary Examiner—George T. Ozaki
Attorney, Agent, or Firm—Guido Modiano; Albert Josif

[57] ABSTRACT

This method, requiring a smaller number of masking steps with respect to the known methods, comprises boron implant on the surface of an epitaxial layer, without masking, and arsenic implant in predetermined locations of the epitaxial layer surface by means of an appropriate mask. A subsequent thermal treatment then leads to diffusion of the implanted arsenic and boron atoms, but boron diffusion in the regions in which arsenic implant has also occurred is prevented by the interaction with the latter, to thereby obtain regions with an N+ type conductivity where both boron and arsenic have been implanted and regions of P type conductivity where only boron has been implanted.

4 Claims, 9 Drawing Figures

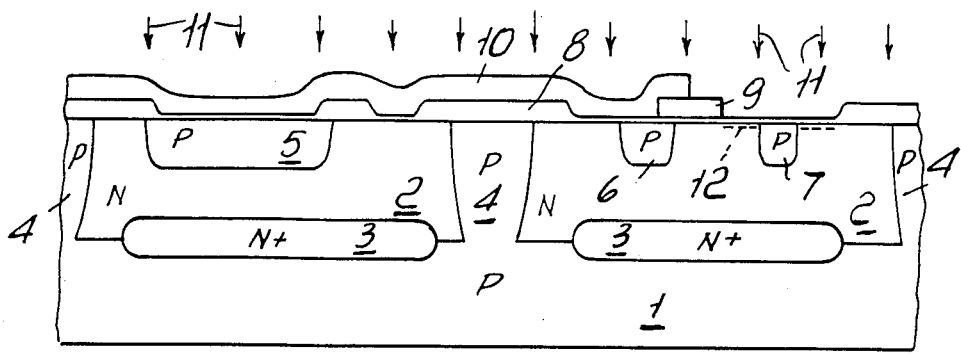
PRIOR ART Fig. 1a
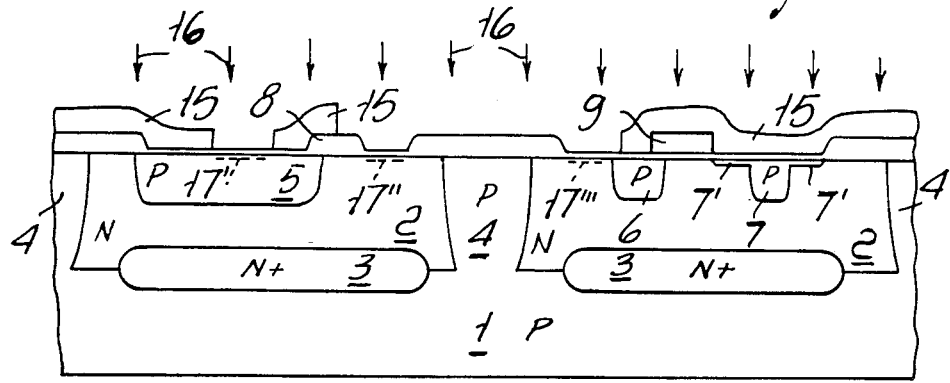
PRIOR ART Fig. 1b
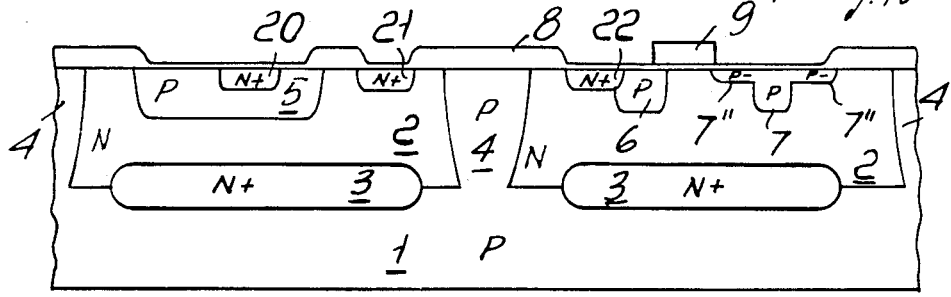
PRIOR ART Fig. 1c
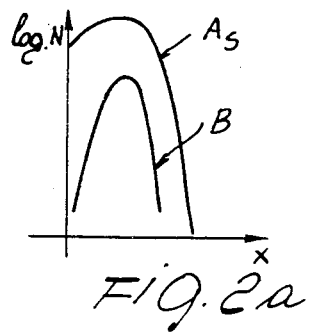
Fig. 2a
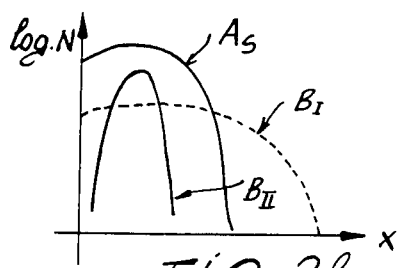
Fig. 2b

MANUFACTURING INTEGRATED CIRCUITS CONTAINING P-CHANNEL MOS TRANSISTORS AND BIPOLAR TRANSISTORS UTILIZING BORON AND ARSENIC AS DOPANTS

BACKGROUND OF THE INVENTION

The present invention relates to a method for the manufature of integrated electronic devices, in particular high voltage P-channel MOS transistors, and specifically for the manufacture of integrated circuits comprising a MOS transistor of the above specified type and another device having an N+ region in the epitaxial layer, such as, e.g., NPN and PNP bipolar transistors, P-channel and N-channel MOS and D-MOS transistors or integrated resistors provided in N+ regions.

Currently, in order to manufacture integrated circuits comprising at least one high voltage P-channel MOS transistor and another device of the specified type, a series of phases is provided to obtain at least the drain extension region of the P-channel MOS and of the N+ regions of the same MOS and of the associated device. In practice, in the prior art devices, the surface is masked to allow a boron implant only at the main surface area of the device in which the drain extensions will be provided, and then again masked to perform a phosphorus implant to provide the N+ regions. A subsequent thermal treatment causes diffusion of the boron and respectively of the phosphorus in the related regions as well as oxidation of the device surface.

Such a method, though currently in widespread use, is expensive because of the need to produce two different masks to obtain, respectively, the drain extension region and the additional N+ regions.

SUMMARY OF THE INVENTION

The aim of the invention is therefore to provide a method for manufacturing of integrated electronic devices, in particular high voltage P-channel MOS transistors, having a smaller number of process phases.

Within the scope of this aim, a particular object of the present invention is to provide a method requiring only a mask in order to from the P− and N+ regions in the epitaxial layer, thus reducing manufacture costs and times for the finished electronic device, so as to make the same device cheaper.

Another object of the present invention is to provide a method which uses single phases which are per se known in the electronics industry, and therefore can be easily performed by means of currently in use machines, which is furthermore completely reliable, and allow manufacturing of devices which are equivalent to the devices manufactured according to the known methods.

This aim, the objects mentioned and others which will become apparent hereinafter, are achieved by a method for the manufacture of integrated electronic devices, in particular high voltage P-channel MOS transistors, comprising a plurality of phases for providing an epitaxial layer which defines a main surface of the device, at least a first region with P− conductivity in said epitaxial layer and at least a second region with N+ conductivity in said epitaxial layer, characterized in that to provide said first region with P− conductivity a boron implanting is performed on said main surface of the device, with no masking, and to provide said second region with N+ conductivity an implanting of arsenic is performed on portions of said main surface which are preset by means of an appropriate mask, and subsequently a heat treatment phase is carried out to diffuse the implanted boron and arsenic, so that said boron and said arsenic interact in said preset portions and the arsenic inhibits the diffusion of the boron in said preset regions.

BRIEF DESCRIPTION OF THE DRAWINGS

Further characteristics and advantages of the invention will become apparent from the following description of a preferred, but not exclusive, embodiment of the method according to the invention, explained with reference to the accompanying drawings, wherein:

FIGS. 1a to 1c illustrate three successive phases for manufacturing a high voltage P-channel MOS transistor and an NPN bipolar transistor according to prior art;

FIGS. 2a and 2b show two diagrams related to the distribution of arsenic and or boron in a semiconductor, respectively after implanting and after diffusion.

DESCRIPTION OF THE PREFERRED EMBODIMENTS

Figure 3A:
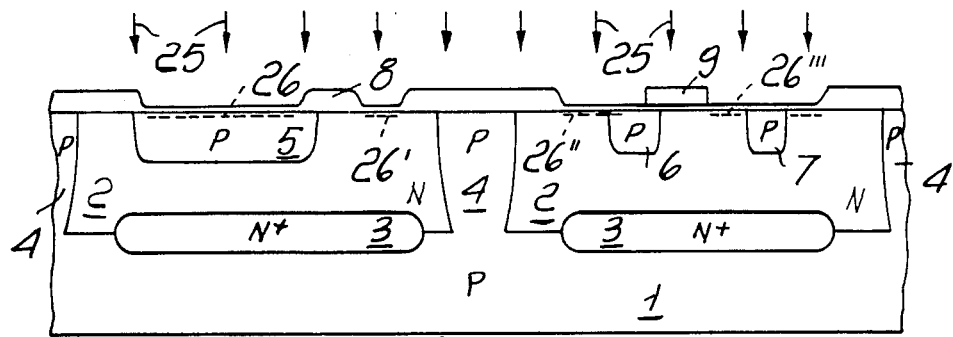
FIGS. 3a to 3d illustrate four successive phases for the manufacture of the same device of FIG. 1c, with the method according to the present invention.
Figure 3B:
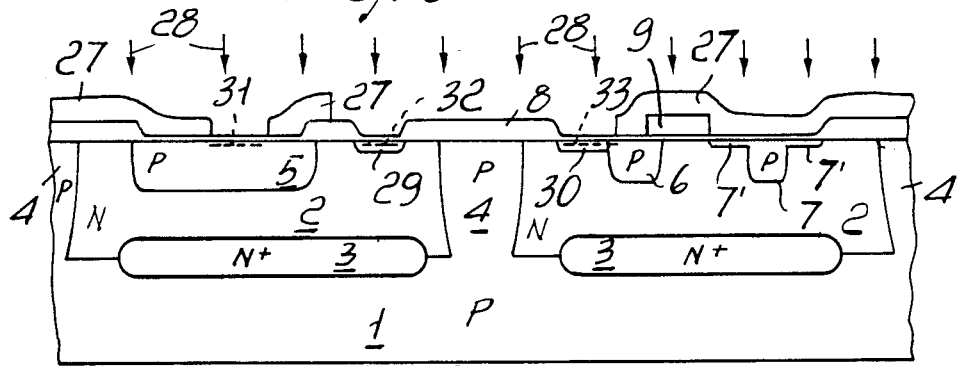

FIG. 1 illustrates three successive phases in the manufacture of an integrated circuit or device comprising a high voltage P-channel MOS transistor and an NPN bipolar transistor, limited to the phases of the manufacture of the drain extension and of the N+ source region of the MOS transistor on one side and of the emitter region and of the collector-enriched region of the bipolar transistor on the other.

The starting structure comprises a P-Silicon substrate indicated at 1 and an N epitaxial Silicon layer 2, including N+buried layer regions 3 and P-type isolating regions 4 which exetnd between a main surface of the integrated circuit and the substrate 1.

In this phase, the P-type base region 5 of the bipolar transistor and the P-type source 6 and drain 7 regions of the MOS transistor are already formed. Above the main surface of the circuit, an oxide layer 8 with differentiated thickness is provided, on which a masking layer 10 of photoresist has already been deposited, which layer covers all the main surface except for the area overlying the drain extension region. In FIG. 1, the arrows 11 indicate the boron implant, while the dashes 12 symbolize the boron atoms implanted in the epitaxial layer 2 in the region not covered by the mask 10.

According to the prior art method, after the boron implant, the mask is removed and a second photoresist mask (indicated in FIG. 1b with 15) is deposited to perform a phosphorus implant, schematically indicated by the arrows 16. As can be seen in FIG. 1b, during this phase the previously boron-implanted region is completely covered and the mask has window portions at the areas where the N+ type regions will be formed. As a consequence, in the figure the dashes 17' indicate the phosphorus atoms for forming the emitter region of the bipolar transistor, the dashes 17" indicated the atoms which will constitute the enriched region for the collector and the dashes 17''' indicate the phosphorus atoms which will constitute the enriched region for the body contact of the MOS transistor. In this figure, 7' indicates the thin regions in which there is an accumulation of boron atoms which will constitute the drain extensions.

According to the prior art, then the second photoresist mask is completely removed, and a thermal process is carried out to diffuse the implanted boron and phosphorus atoms. This phase, as is pointed out in FIG. 1c, causes formation of the emitter region 20 of the bipolar transistor, of the enriched collector region 21 of the bipolar transistor, of the N+ enrichment region 22 for the body contact of the MOS transistor and of the P− drain extension regions 7″ of the MOS transistor.

As can be seen, the method according to the prior art therefore requires two lithographic processes to obtain the two separate masks for boron and phosphorus implanting.

According to the invention, on the contrary, the regions with N+ type conductivity and of the region with P− type conductivity are formed by meanas of a single mask, exploiting the different behavior of boron when interacting with arsenic, which can be used to obtain the N+ regions in the place of phosphorus. Such behavior is illustrated in the two diagrams of FIG. 2 which depict the distribution of arsenic and boron atoms inside a semiconductor layer respectively after implant and after diffusion by thermal treatment. In paraticular, in the case of an implant causing a distribution of arsenic and of boron as illustrated in FIG. 2a, after the subsequent thermal treatment, arsenic has the distribution as illustrated in the single curve of FIG. 2b, and boron has a distribution depending on arsenic having been implanted or not in the same region. In particular, the broken curve $B_I$ illustrates the distribution of boron in a semiconductor layer in which arsenic has not also been implanted, while the continuous curve $B_{II}$ indicates the distribution of boron after the diffusion if arsenic has also been implanted in the same region. As can be seen, arsenic constitutes, in practice, an inhibitor to the diffusion of boron, so that in practice, in all the implanted regions, the behavior is dominated by the arsenic atoms implant. This behavior is employed in the method according to the invention, so as to eliminate the prior art masking and associated lithographic processes for performing a boron implant. In practice, according to the invention, a boron implant is performed over all the main surface of the device, and only the regions to be formed with N+ conductivity are implanted with arsenic thus inhibiting diffusion of the implanted boron, finaly giving regions with N+ type conductivity.

An example of the method for the manufacture of an integrated circuit similar to the one of FIG. 1, but with the method according to the invention, is described with reference to FIG. 3, which illustrates four successive steps of the method according to the invention. Also in this case, only the steps related to the production of the regions with N+ and P− conductivity inside the epitaxial layer are described, omitting the preceding phases, carried out according to the prior art techniques for obtaining the same starting structure as illustrated in FIG. 1a. Consequently, the same parts have been referenced with the same reference numerals.

Thus, FIG. 3a shows a structure comprising a substrate 1, an epitaxial layer 2, buried layers 3 and insolating layers 4. This structure furthermore comprises the base region 5 of the bipolar transistor and the P-type source 6 and drain 7 regions of the MOS transistor. On the main upper surface of the device, an oxide layer 8 with differentiated thickness is applied, and the gate region 9 of the N-MOS transistor has already been formed. At this stage, boron implant (symbolized in FIG. 3a by the arrows 25) is performed, which leads to accumulation of boron atoms on the main surface of the integrated circuit or device in the reduced thickness regions of the oxide layer 8, as schematically illustrated by the dashes 26 in the base region 5, by the dashes 26′ in the collector region, where the enriched N+ type region will be formed, by the dashes 26″ where the enriched body region will be formed and inside the source layer 6 of the MOS transistor and finally by the dashes 26‴ adjacent to the drain region 7 to provide the drain extension region.

At the end of the boron implant, a single masking is performed, including deposition of a photoresist layer 27 on preset portions of the main surface of the integrated circuit, where the arsenic is not to be implanted. In particular, the region where the drain extensions will be provided is covered. Then, as symbolized in FIG. 3b by the arrows 28, arsenic is implanted, causing accumulation of arsenic atoms in the unprotected regions, as illustrated in the figure by the dashes 31 (where the emitter of the bipolar transistor will be formed), by the dashes 32 (where the enriched collector region will be formed), and by the dashes 33 (to form the enriched body contact region of the MOS transistor). In this figure, the regions 29, 30, and 7′, having a concentration of boron atoms due to the previous implant, are also indicated schematically.

Figure 3C:
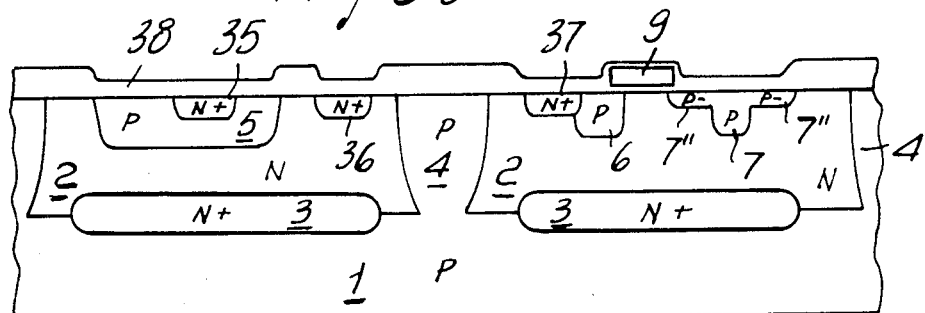
Figure 3D:
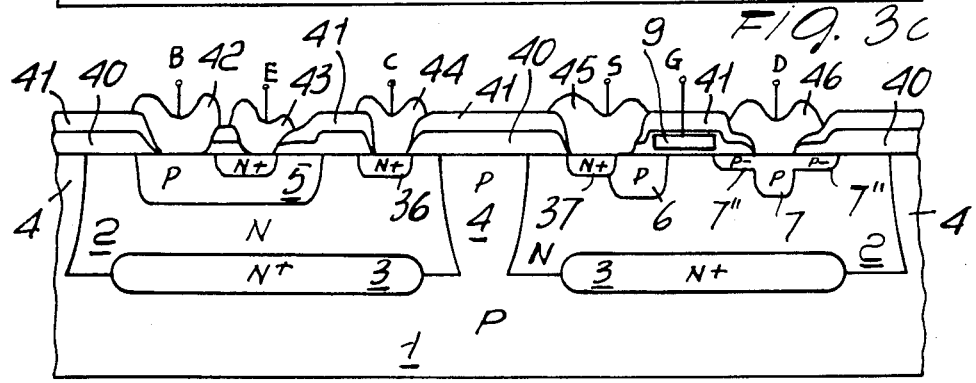

The subsequent phases of the process occur in a known manner and lead to the manufacture of a conventional structure, as is illustrated in FIGS. 3c and 3d. Indeed, at the end of arsenic implant, according to the current art, the mask is removed and a thermal process is performed to diffuse the implanted atoms, as well as to oxidize the main surface of the device. Consequently, by virtue of the interaction of arsenic and boron atoms, and in particular the inhibition effected by the former ones onto the latter ones, in spite of the boron implant, a region 35 of the N+ type, which constitutes the emitter of the bipolar transistor, a region 36 of the N+ type, which forms the enriched collector zone of the same transistor, a region 37 of the N+ body contact type of the MOS transistor and of the regions 7″ of the P− drain extension regions of the MOS transistor are formed. Furthermore, the oxide layer 38 is formed on the entire main upper surface of the device. Then usual phases are carried out to obtain oxide portions 40 through chemical etching from the layer 38, second oxide layer portions 41 through vapor-phase chemical deposition, and base 42, emitter 43, and collector 44 metalizations of the bipolar transistor and source 45 and drain 46 metalization of the MOS transistor to provide the contacts with the respective electrodes as illustrated in the figure.

As can be seen from the above description, the invention fully achieves the intended aims. Indeed, a method has been disclosed which allows manufacture of regions with N+-and P− conductivity with a smaller number of phases than prior methods, in particular through the elimination of a lithographic process, with a consequent reduction in manufacturing times and costs of the finished product.

The method described above is therefore simpler than the known ones, though it comprises phases which are per se known in the industry for the manufacture of electronic devices and therefore can be achieved with currently available machines.

The invention thus conceived is susceptible to numerous modifications and variations, all of which are within the scope of the inventive concept. In particular, the method according to the invention can be used for the manufacture even only of high voltage P-channel MOS transistors to form channel and source extension regions, or to produce, in a single integrated circuit, a high voltage P-channel MOS transistor and other devices, such as, e.g., PNP bipolar transistors, N-channel and P-channel MOS and D-MOS transistors, as well as to manufacture integrated resistors formed by an N+ layer. Furthermore, though it is preferred to perform the boron implant phase first and then the arsenic implant phase, the two phases can be exchanged for each other, achieving the same results.

Furthermore, all the details may be replaced by other technically equivalent ones.

We claim:

1. Method for manufacturing integrated electronic devices, in particular high voltage P-channel MOS transistors by forming an epitaxial layer defining a device's main surface, at least a first P-type region in said epitaxial layer and at least a second N-type region in said epitaxial layer, characterized in that for forming said first P-type region a boron implant is performed on said main surface, without masking, and for forming said second N-type region an arsenic implant is performed on selective portions of said device main surface, through a mask, and subsequently a thermal treatment phase is carried out to diffuse implanted boron and arsenic, thereby in said selective portions an interaction between said boron and said arsenic and inhibition of boron diffusion by arsenic occur.

2. Method according to claim 1, characterized in that is comprises forming an oxide layer with differentiated thickness on said device main surface before said boron implant, then said arsenic implant and further known phases are performed for end manufacturing electronic devices.

3. Method according to claim 1, including simultaneously manufacturing at least one first electronic device having at least said first P-type region and at least a second electronic device having at least said second N-type region.

4. Method according to claim 3, characterized in that said at least one first electronic device is a high voltage P-channel MOS transistor, said first P-type region conductivity being a drain extension region and said at least one second device is selected from a group consisting of NPN and PNP transistors, N-channel and P-channel MOS and D-MOS transistors, and integrated resistors formed in N-conductivity regions.

* * * * *